United States Patent
Sugano (10) Patent No.: US 7,329,322 B2
(45) Date of Patent: Feb. 12, 2008

(54) EXHAUST APPARATUS, SEMICONDUCTOR DEVICE MANUFACTURING SYSTEM AND METHOD FOR MANUFACTURING SEMICONDUCTOR DEVICE

(75) Inventor: Kou Sugano, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 544 days.

(21) Appl. No.: 11/101,462

(22) Filed: Apr. 8, 2005

(65) Prior Publication Data

US 2005/0173066 A1    Aug. 11, 2005

Related U.S. Application Data

(63) Continuation of application No. 10/011,725, filed on Dec. 11, 2001, now Pat. No. 6,907,892.

(30) Foreign Application Priority Data

Feb. 7, 2001    (JP)    ............... 2001-030576

(51) Int. Cl.
*B08B 5/00*    (2006.01)
*B08B 3/00*    (2006.01)
(52) U.S. Cl. .............. 134/26; 134/27; 134/28; 134/29; 134/34; 134/37; 134/42
(58) Field of Classification Search .......... 134/26, 134/27, 28, 29, 34, 36, 37, 42
See application file for complete search history.

(56) References Cited

U.S. PATENT DOCUMENTS 4,353,388 A    10/1982    Isoyama et al.
5,395,482 A *   3/1995    Onda et al. .............. 216/73
6,050,276 A *   4/2000    Harada et al. ........... 134/121
2003/0094134 A1* 5/2003  Minami .................... 118/715

FOREIGN PATENT DOCUMENTS

| JP | 02-039531 A | 2/1990 |
|----|-------------|--------|
| JP | 06-163494 A | 6/1994 |
| JP | 10-288276   | 10/1998 |

* cited by examiner

*Primary Examiner*—Michael Barr
*Assistant Examiner*—Saeed Chaudhry
(74) *Attorney, Agent, or Firm*—McDermott Will & Emery LLP (57) ABSTRACT

In an exhaust pipe, a rotating shaft takeoff connection is provided so as to support a rotating shaft for rotating a switching valve fixed thereon. The rotating shaft extends to the outside of the exhaust pipe and is provided with an introduction hole and branch holes in such a manner that the introduction hole and the branch holes are communicated with each other to form through holes extending from the outside to the inside of the exhaust pipe. Into a gap between the rotating shaft takeoff connection and the rotating shaft, purge gas is introduced via the introduction hole and the branch holes. Furthermore, pure water is introduced into the gap via the introduction hole and the branch holes. By utilizing the purge gas, exhaust gas within the exhaust pipe is prevented from leaking outside the pipe and by utilizing the pure water, accumulated solid substance are prevented from adhering to the related parts of the pipe.

10 Claims, 6 Drawing Sheets

EXHAUST APPARATUS, SEMICONDUCTOR DEVICE MANUFACTURING SYSTEM AND METHOD FOR MANUFACTURING SEMICONDUCTOR DEVICE

The present application is a continuation of U.S. application Ser. No. 10/011,725, filed on Dec. 11, 2001 now U.S. Pat. No. 6,907,892.

BACKGROUND OF THE INVENTION

The present invention relates to an exhaust apparatus equipped with an exhaust pressure adjusting unit capable of adjusting the opening area of an exhaust pipe variably, a semiconductor device manufacturing system having the exhaust apparatus and a method for manufacturing a semiconductor device employing the semiconductor device manufacturing system.

Conventionally, in semiconductor device manufacturing process steps such as a cleaning step and an etching step, by using such chemicals as sulfuric acid ($H_2SO_4$), hydrofluoric acid (HF), aqueous hydrogen peroxide ($H_2O_2$), ammonia water ($NH_4OH$) and hydrochloric acid (HCl), the surface processing such as a cleaning of semiconductor wafers and an etching of such material as a silicon oxide film and/or a photoresist film formed on a semiconductor wafer have been performed.

A cleaning apparatus and an etching apparatus that use the above-stated chemicals are equipped with an exhaust pipe connected to an exhaust duct to prevent such resultant gas mixture as harmful gas generated from the chemicals from leaking into a clean room, while preventing dust from adhering to the surface of a semiconductor wafer. That is, the apparatuses are configured so that the resultant gas is forcibly exhausted outside a clean room via the exhaust pipe and the exhaust duct.

Figure 5:
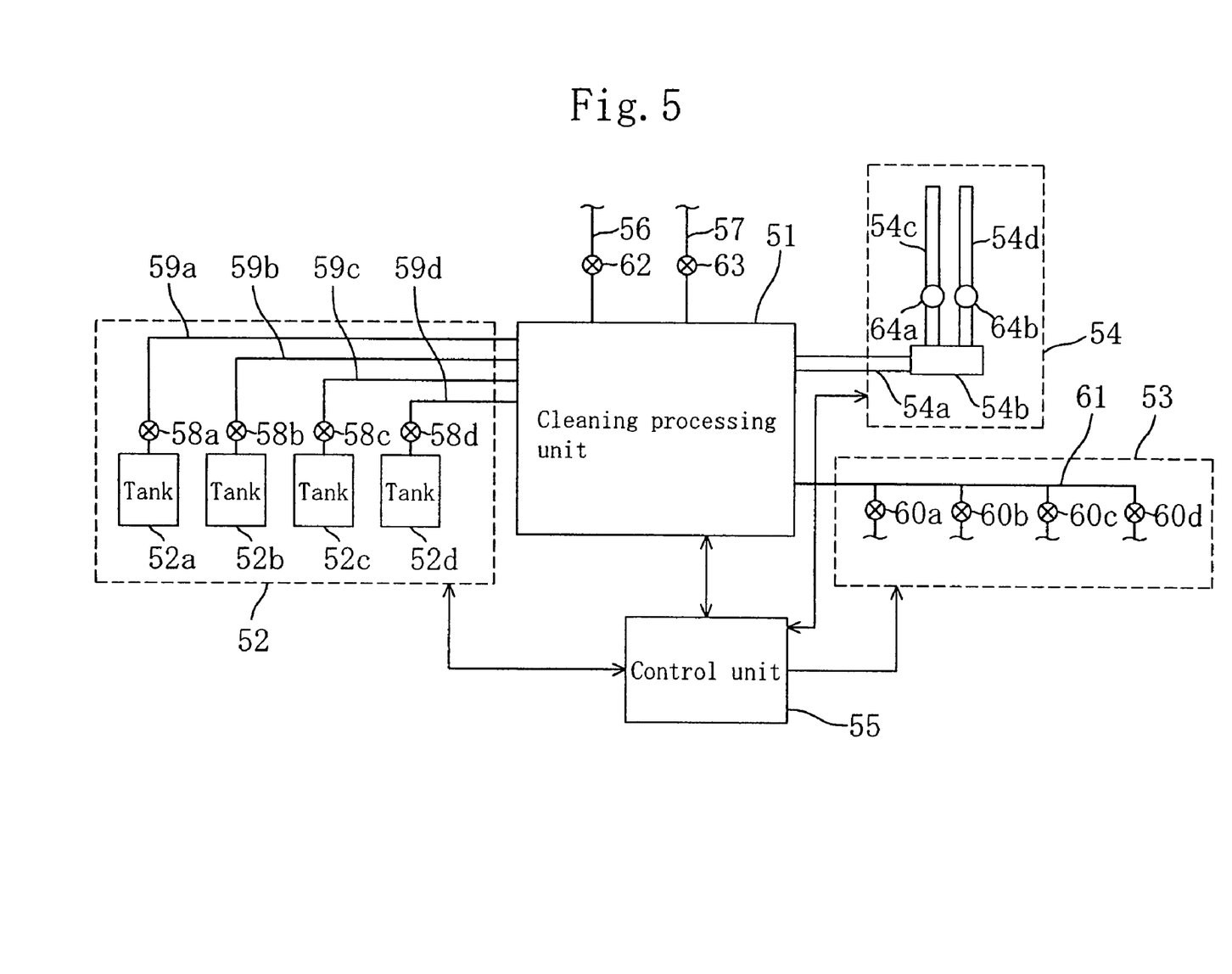
FIG. 5 is a block diagram illustrating a configuration of a conventional cleaning apparatus.

FIG. 5 is a block diagram illustrating the configuration of a conventional cleaning apparatus. This cleaning apparatus comprises a cleaning processing unit 51 for cleaning semiconductor wafers, a chemical storage unit 52 consisting of chemical feed tanks 52a, 52b, 52c and 52d for storing such chemicals as sulfuric acid, hydrofluoric acid, aqueous hydrogen peroxide, ammonia water and hydrochloric acid, respectively, a waste liquid collection unit 53 for collecting waste liquid generated after usage of chemicals in the cleaning processing unit 51 in accordance with the classification of the waste liquid, an exhaust processing unit 54 for exhausting such resultant gas mixture as harmful gas generated from the cleaning processing unit 51, and a control unit 55 for controlling respective equipments disposed in the cleaning processing unit 51, the chemical storage unit 52, the waste liquid collection unit 53 and the exhaust processing unit 54.

The cleaning processing unit 51 is in flow communication with a pure water supply pipe 56 for supplying pure water and a gas introduction pipe 57 for introducing nitrogen gas via switching valves 62 and 63, respectively. In addition, the chemical feed tanks 52a, 52b, 52c and 52d are in flow communication on feed sides with the cleaning processing unit 51 via chemical supply pipes 59a, 59b, 59c and 59d, respectively, on which switching valves 58a, 58b, 58c and 58d are mounted respectively.

Furthermore, the waste liquid collection unit 53 is provided with a drain line 61 to collect the waste liquid and the drain line 61 is provided with branch pipes to collect the waste liquid in accordance with the classification of the waste liquid, and switching valves 60a, 60b, 60c and 60d are mounted on the branch pipes, respectively. Note that the branch pipes are connected to liquid drainage pipes (not shown) respectively to drain the waste liquid outside a clean room.

The exhaust processing unit 54 comprises a main exhaust pipe 54a having a flow communication portion connected to the cleaning processing unit 51, an exhaust distributing unit 54b provided on the end portion of the main exhaust pipe 54a, and an alkaline exhaust pipe 54c and an acid exhaust pipe 54d extending from the exhaust distributing unit 54b. The alkaline exhaust pipe 54c and the acid exhaust pipe 54d are provided with exhaust pressure adjusting units 64a and 64b, respectively, capable of adjusting the opening area of the exhaust pipe variably. In addition, the end portions of the alkaline exhaust pipe 54c and the acid exhaust pipe 54d are connected to exhaust ducts (not shown) respectively for exhausting exhaust gas forcibly outside a clean room.

The operation of the cleaning apparatus having the above-described configuration will be explained below. For example, the operation for cleaning semiconductor wafers with a mixture of sulfuric acid and aqueous hydrogen peroxide is described as follows: first, semiconductor wafers to be cleaned are loaded into the cleaning processing unit 51; and then in the chemical storage unit 52, the switching valves for the chemical feed tanks storing sulfuric acid and aqueous hydrogen peroxide are opened by the control unit 55; and simultaneously in the waste liquid collection unit 53, the switching valve for collecting the mixture of sulfuric acid and aqueous hydrogen peroxide is opened; furthermore, in the exhaust processing unit 54, the alkaline exhaust pipe 54c is closed by the exhaust pressure adjusting unit 64a to enter closed status and the acid exhaust pipe 54d is opened by the exhaust pressure adjusting unit 64b to enter opened status; accordingly, resultant acid gas generated from the mixture of sulfuric acid and aqueous hydrogen peroxide is forcibly exhausted into an acid processing apparatus located outside a clean room via the acid exhaust pipe 54d and the exhaust duct.

However, there has been seen a problem that the resultant gas to be exhausted leaks from respective rotating shaft takeoff connections of the exhaust pressure adjusting units 64a and 64b, which are provided in the alkaline exhaust pipe 54c and the acid exhaust pipe 54d of the exhaust processing unit 54, respectively, resulting in the exhaust gas leakage from the exhaust pipes.

Figure 6:
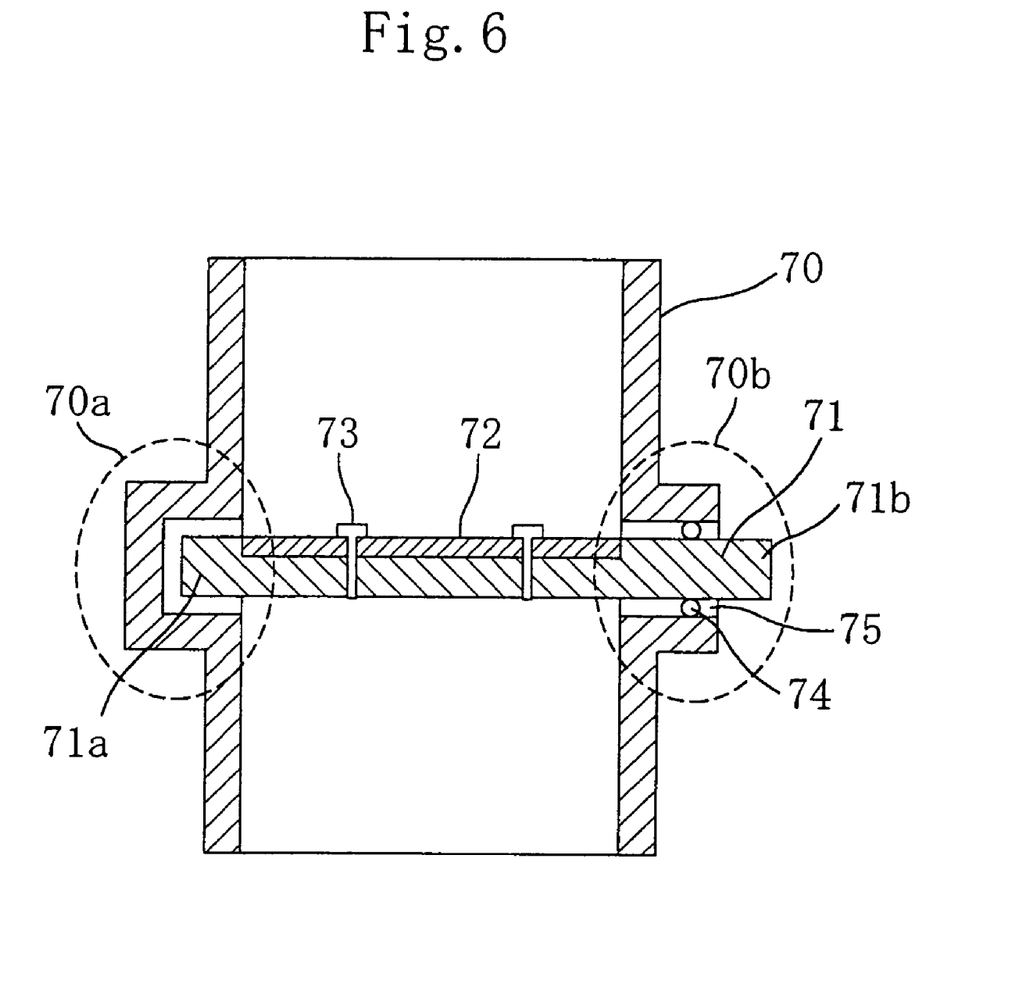
FIG. 6 is a cross sectional view of an exhaust apparatus equipped with a conventional exhaust pressure adjusting unit.

FIG. 6 is a sectional view of the exhaust apparatus equipped with the conventional exhaust pressure adjusting unit 64a or 64b shown in FIG. 5. That is, FIG. 6 illustrates a configuration of the exhaust apparatus used both in the alkaline exhaust pipe 54c and the acid exhaust pipe 54d. The exhaust apparatus comprises a disc-shaped switching valve 72 having a diameter approximately equal to the inner diameter of an exhaust pipe 70, a rotating shaft 71 for rotating the switching valve 72 and fixing screws 73 for fixing the switching valve 72 along a diameter of the shaft to the rotating shaft 71. As described above, the switching valve 72 is configured to be rotatable on the shaft passing along the diameter of the valve. In addition, one end portion 71a of the rotating shaft 71 is inserted into a concave rotating shaft bearing portion 70a formed in the exhaust pipe 70 and the other end portion 71b of the rotating shaft 71 is taken out of the exhaust pipe 70 to the outside of the pipe through the cylinder-shaped rotating shaft takeoff connection 70b formed in the exhaust pipe 70. That is, the disc-shaped switching valve 72 and the rotating shaft 71 are supported rotatably by the rotating shaft bearing portion 70a and the rotating shaft takeoff connection 70b, and thus the amount of exhaust gas to be exhausted can be adjusted variably in accordance with the rotated position of the switching valve 72. In the other end portion 71b of the rotating shaft 71, an airtight O-ring 74 for preventing exhaust gas to be exhausted from leaking and a groove (not shown) for the airtight O-ring 74 to be fixed thereto are provided.

In the exhaust apparatus configured in this manner, the internal pressure of the exhaust pipe 70 is lower than the atmospheric pressure in the usual condition since the gas included in the pipe is sucked by the exhaust fan installed outside and therefore, the resultant gas mixture (exhaust gas) to be exhausted never leaks outside from the exhaust pipe 70. However, for example, many semiconductor device manufacturing systems are connected to the exhaust duct, which is in flow communication with the exhaust fan on one end, and when simultaneous running of these semiconductor device manufacturing systems requires the exhaust fan to exhaust larger amount of gas than the exhausting capacity of the fan, the internal pressure of the exhaust pipe 70 becomes higher than the atmospheric pressure in some cases. In this case, micro gap is formed along the circumference of the airtight O-ring 74 for the following reason. That is, although the airtight O-ring 74 is disposed to fill the gap 75 between the rotating shaft takeoff connection 70b of the exhaust pipe 70 and the rotating shaft 71, the O-ring is not capable of sealing the internal space of the exhaust pipe 70 completely. Therefore, the exhaust gas to be exhausted is in danger of leaking outside the exhaust pipe 70 via the micro gap when the internal pressure of the exhaust pipe 70 becomes higher than the atmospheric pressure.

SUMMARY OF THE INVENTION

An object of the present invention is to provide an exhaust apparatus highly capable of preventing an exhaust gas to be exhausted from leaking outside an exhaust pipe, at the same time being equipped with an exhaust pressure adjusting unit capable of adjusting the opening area of the exhaust pipe variably, a semiconductor device manufacturing system having the exhaust apparatus, and a method for manufacturing a semiconductor device employing the semiconductor device manufacturing system.

An exhaust apparatus of the present invention comprises an exhaust pressure adjusting unit for adjusting an opening area of an exhaust pipe variably, wherein: the exhaust pressure adjusting unit having: a switching valve, provided rotatably in the exhaust pipe, for varying an opening area of the exhaust pipe; a rotating shaft, extending from inside to outside of the exhaust pipe, for rotating the switching valve fixed thereon; a rotating shaft takeoff connection, provided in the exhaust pipe, for supporting a portion of the rotating shaft, the portion being located between an inner portion and an outer portion of the exhaust pipe; and gas introduction means for introducing purge gas into a gap between the rotating shaft takeoff connection and the rotating shaft.

By employing the above-described configuration of the exhaust apparatus, purge gas is introduced into the gap between the rotating shaft takeoff connection and the rotating shaft by the gas introduction means and exhaust gas to be exhausted can be thus prevented from leaking outside the exhaust pipe even when the inner pressure of the exhaust pipe becomes higher than the atmospheric pressure.

In the exhaust apparatus, the gas introduction means may include a purge gas introduction hole provided in the rotating shaft such that one end portion of the hole faces an inner side of the exhaust pipe and another end portion of the hole faces an outer side of the exhaust pipe.

In addition, as another configuration of the gas introduction means, the gas introduction means may include a purge gas introduction hole provided in the rotating shaft takeoff connection of the exhaust pipe.

The exhaust apparatus may further comprises liquid introduction means for introducing a cleaning solution or cleaning vapor into the gap between the rotating shaft takeoff connection and the rotating shaft, and thus, accumulated solid substance adhering to the parts such as the rotating shaft takeoff connection of the exhaust pipe can easily be removed, resulting in the further improvement of airtightness of the exhaust apparatus.

A semiconductor device manufacturing system of the present invention comprises a wafer processing apparatus, at least one exhaust pipe connected to the wafer processing apparatus, and an exhaust apparatus equipped with an exhaust pressure adjusting unit for adjusting an opening area of the at least one exhaust pipe variably, wherein: the exhaust pressure adjusting unit having: a switching valve, provided rotatably in the exhaust pipe, for varying an opening area of the exhaust pipe; a rotating shaft, extending from inside to outside of the exhaust pipe, for rotating the switching valve fixed thereon; a rotating shaft takeoff connection, provided in the exhaust pipe, for supporting a portion of the rotating shaft, the portion being located between an inner portion and an outer portion of the exhaust pipe; and gas introduction means for introducing purge gas into a gap between the rotating shaft takeoff connection and the rotating shaft.

By employing the above-described configuration of the semiconductor device manufacturing system, during the wafer processing performed by the wafer processing apparatus thereof, purge gas is introduced into the gap between the rotating shaft takeoff connection and the rotating shaft by the gas introduction means in the exhaust apparatus, and therefore, even when the inner pressure of the exhaust pipe becomes higher than the atmospheric pressure, the gas generated from the wafer processing apparatus can be prevented from leaking outside the exhaust pipe.

The exhaust apparatus further comprises an exhaust distributing unit extending from the wafer processing apparatus and the at least one exhaust pipe is composed of a plurality of exhaust pipes extending from the exhaust distributing unit, each of the plurality of exhaust pipes being provided with the exhaust pressure adjusting unit, whereby various kinds of exhaust gas such as acid gas and/or alkaline gas can be securely prevented from leaking outside the pipe.

The gas introduction means may include a purge gas introduction hole provided in the rotating shaft such that one end portion of the hole faces inner side of the exhaust pipe and another end portion of the hole faces outer side of the exhaust pipe.

As another configuration of the gas introduction means, the gas introduction means may include a purge gas introduction hole provided in the rotating shaft takeoff connection of the exhaust pipe.

A method for manufacturing a semiconductor device utilizing a semiconductor device manufacturing system that includes a wafer processing apparatus, an exhaust pipe connected to the wafer processing apparatus, and an exhaust apparatus equipped with an exhaust pressure adjusting unit for adjusting an opening area of the exhaust pipe variably, comprises a step (a) for cleaning the wafer with chemicals in the wafer processing apparatus, a step (b) for rinsing the wafer with water after completion of the step (a), and a step (c) for drying the wafer in the wafer processing apparatus after completion of the step (b), wherein purge gas is introduced into the exhaust pressure adjusting unit of the exhaust pipe in the step (a).

By utilizing the above-described method, the gas flow from inside to outside of the exhaust pipe is prevented by the purge gas and the resultant gas mixture generated by the chemical processing of wafer is thus prevented from leaking outside the exhaust pipe.

The method for manufacturing a semiconductor device described above further comprises a cleaning agent introduction step for introducing a cleaning solution or cleaning vapor into the exhaust pressure adjusting unit, the step being performed simultaneously in any one of the steps (a) and (b), or being inserted between the steps (a) and (b), whereby accumulated solid substance can be prevented from adhering to the related parts of the exhaust pressure adjusting unit and as a result, the airtightness of exhaust pressure adjusting unit can be improved.

DETAILED DESCRIPTION OF THE INVENTION

First Embodiment

Figure 1:
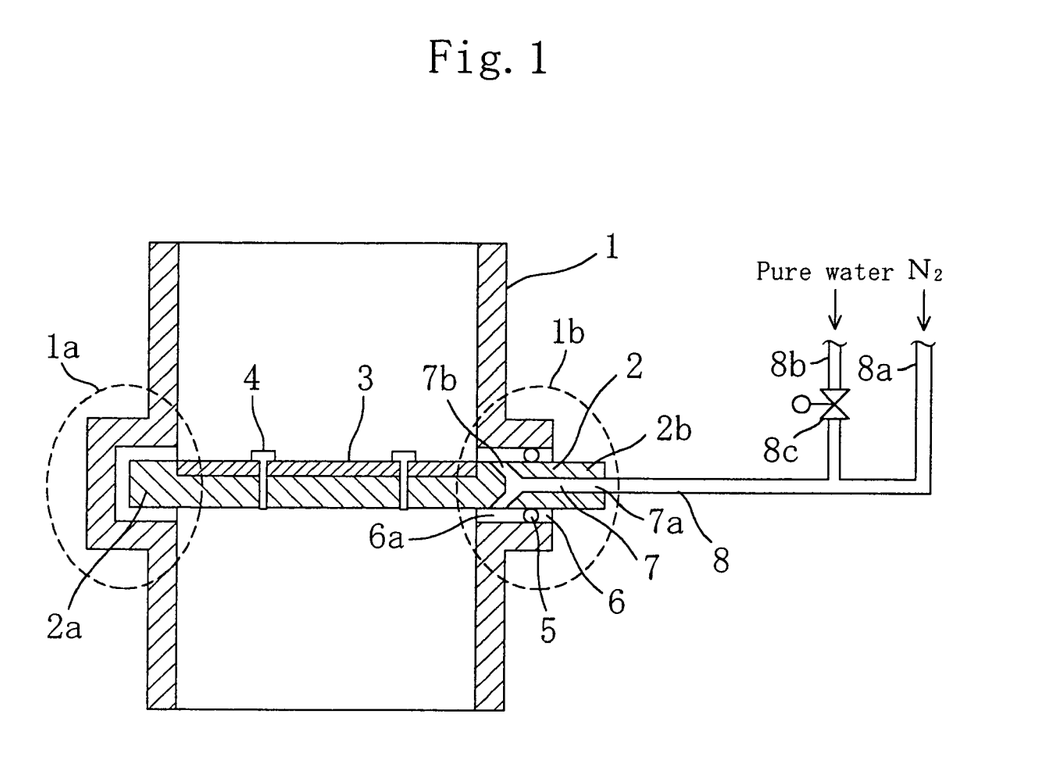
FIG. 1 is a cross sectional view of an exhaust apparatus equipped with an exhaust pressure adjusting unit, which is employed in a first embodiment of the present invention.

FIG. 1 is a cross sectional view of an exhaust apparatus equipped with an exhaust pressure adjusting unit capable of adjusting the opening area of the exhaust pipe variably, which is applied to a first preferred embodiment of the present invention. FIG. 1 illustrates a structural configuration of the exhaust apparatus used both in an alkaline exhaust pipe and an acid exhaust pipe.

The exhaust pressure adjusting unit comprises an exhaust pipe 1 made of vinyl chloride resin, a disc-shaped switching valve 3 made of vinyl chloride resin having a diameter approximately equal to the inner diameter of the exhaust pipe 1 and a rotating shaft 2 made of stainless steel for rotating the switching valve 3 that is fixed to the rotating shaft 2 along a diameter of the switching valve 3 by fixing screws 4. Namely, the switching valve 3 is configured to be rotatable on the shaft passing along the diameter of the valve. Note that the switching valve is not necessarily designed to rotate on the shaft passing along the diameter of the valve, but may be configured to be movable so as to vary the opening area of the exhaust pipe 1. In addition, one end portion 2a of the rotating shaft 2 is inserted into a concave rotating shaft bearing portion 1a formed in the exhaust pipe 1 and the other end portion 2b of the rotating shaft 2 is taken out of the exhaust pipe 1 to the outside of the pipe through the cylinder-shaped rotating shaft takeoff connection 1b formed in the exhaust pipe 1. In more detail, the disc-shaped switching valve 3 and the rotating shaft 2 are supported rotatably by the rotating shaft bearing portion 1a and the rotating shaft takeoff connection 1b. The gap between the switching valve 3 and the inner circumferential surface of the exhaust pipe 1 varies in accordance with the rotated position of the switching valve 3, whereby the amount of exhaust gas to be exhausted can be adjusted variably. The other end portion 2b of the rotating shaft 2 is provided with an airtight O-ring 5 for preventing exhaust gas to be exhausted from leaking and a groove (not shown) for the airtight O-ring 5 to be fixed thereto. In addition, the apparatus is configured so that the switching valve 3 is cleaned with pure water spouted from beneath.

It should be noted that the exhaust pressure adjusting unit of this embodiment is featured by the following configuration. That is, in the other end portion 2b of the rotating shaft 2, there are provided an introduction hole 7 for introducing purge gas extending along the axis of the rotating shaft 2 and a plurality of (for example, four pieces of) branch holes 7b branching off from the introduction hole 7. In addition, each of the branch holes 7b is formed (being inclined) so as to have a slope angle of about 45 degrees with respect to the axis and an opening facing a gap 6a that is communicated spatially with the inner space of the exhaust pipe 1 on the inner side of the airtight O-ring 5 and constitutes a part of the gap 6 between the rotating shaft takeoff connection 1b of the exhaust pipe 1 and the rotating shaft 2. The introduction hole 7 has an opening in the end face of the other end portion 2b of the rotating shaft 2 and the opening is connected to a purge piping 8. The purge piping 8 is provided with a gas supply piping 8a for always supplying purge gas such as nitrogen gas ($N_2$ gas) or high pressure air to the gap 6a, a pure water supply piping 8b for intermittently supplying pure water to the gap 6a, and a switching valve 8c for controlling the opening/closing operation of the pure water supply piping 8b. As described above, the purge gas introduction means is composed of the introduction hole 7, the branch holes 7b, the purge piping 8, and the gas supply piping 8a. In addition, the liquid introduction means is composed of the introduction hole 7, the branch holes 7b, the purge piping 8, the pure water supply piping 8b, and the switching valve 8c.

According to the exhaust apparatus of this embodiment, purge gas such as nitrogen gas ($N_2$ gas) or high pressure air can be introduced into the gap 6a communicated spatially with the inner space of the exhaust pipe 1, via the gas supply piping 8a, the purge piping 8, the introduction hole 7 and the branch holes 7b in order. Owing to the above-described configuration, even when the inner pressure of the exhaust pipe 1 becomes higher than the atmospheric pressure during the exhaust of resultant gas mixture (exhaust gas) such as harmful gas, by introducing purge gas into the gap 6a in advance, the phenomenon that the exhaust gas to be exhausted leaks outside from the exhaust pipe 1 can be prevented. It should be noted that when the inner pressure of the exhaust pipe 1 becomes high, the exhaust apparatus indicates a distinguished capability in resisting stronger against the flow of the resultant gas mixture toward the outside of the exhaust pipe 1 since the branch holes 7b are not formed orthogonal to the axis of the rotating shaft 2 but formed inclining toward the inner portion of the exhaust pipe 1.

Furthermore, by supplying purge gas such as nitrogen gas via the gas supply piping 8a to the gap 6a, the life duration of the airtight O-ring 5 and the parts being in touch therewith is elongated, whereby the airtightness of the exhaust apparatus is enhanced further.

Moreover, as the exhaust apparatus has a structure such that pure water can be supplied via the pure water supply piping 8b to the related parts, accumulated solid substance adhering to such parts as the rotating shaft 2, the O-ring 5 and the rotating shaft takeoff connection 1b of the exhaust pipe 1 can be removed easily, whereby the airtightness of the exhaust apparatus is enhanced further.

Second Embodiment

Figure 2:
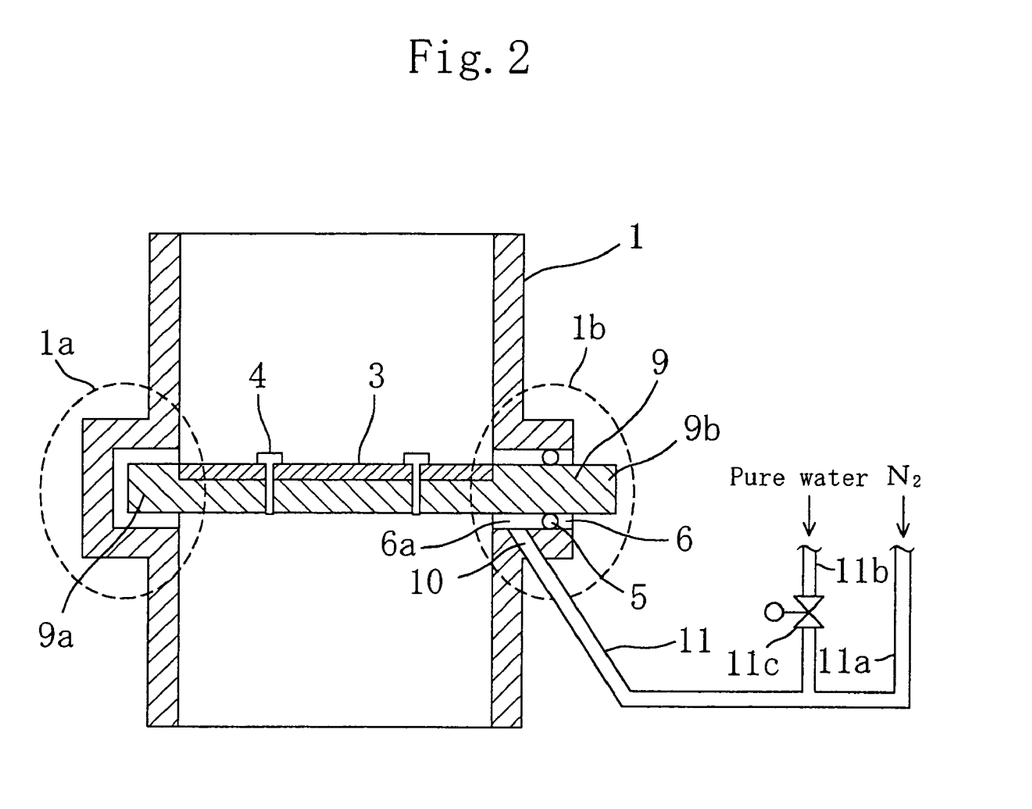
FIG. 2 is a cross sectional view of an exhaust apparatus equipped with an exhaust pressure adjusting unit, which is employed in a second embodiment of the present invention.

FIG. 2 is a cross sectional view of an exhaust apparatus equipped with an exhaust pressure adjusting unit capable of adjusting the opening area of the exhaust pipe variably, which is applied to a second preferred embodiment of the present invention. FIG. 2 illustrates a structural configuration of the exhaust apparatus used both in an alkaline exhaust pipe and an acid exhaust pipe.

The exhaust pressure adjusting unit comprises an exhaust pipe 1 made of vinyl chloride resin, a disc-shaped switching valve 3 made of vinyl chloride resin having a diameter approximately equal to the inner diameter of the exhaust pipe 1, and a rotating shaft 9 made of stainless steel for rotating the switching valve 3 that is fixed to the rotating shaft 9 along a diameter of the valve by fixing screws 4. Namely, the switching valve 3 is configured to be rotatable on the shaft passing along the diameter of the valve. Note that the switching valve is not necessarily designed to rotate on the shaft passing along the diameter of the valve, but maybe configured to be movable so as to vary the opening area of the exhaust pipe 1. In addition, one end portion 9a of the rotating shaft 9 is inserted into a concave rotating shaft bearing portion 1a formed in the exhaust pipe 1 and the other end portion 9b of the rotating shaft 9 is taken out of the exhaust pipe 1 to the outside of the pipe through the cylinder-shaped rotating shaft takeoff connection 1b formed in the exhaust pipe 1. In more detail, the disc-shaped switching valve 3 and the rotating shaft 9 are supported rotatably by the rotating shaft bearing portion 1a and the rotating shaft takeoff connection 1b. The gap between the switching valve 3 and the inner circumferential surface of the exhaust pipe 1 varies in accordance with the rotated position of the switching valve 3, whereby the amount of exhaust gas to be exhausted can be adjusted variably. The other end portion 9b of the rotating shaft 9 is provided with an airtight O-ring 5 for preventing exhaust gas to be exhausted from leaking and a groove (not shown) for the airtight O-ring 5 to be fixed thereto. In addition, the apparatus is configured so that the switching valve 3 is cleaned with pure water spouted from beneath. The above-described configuration is the same as that of the first embodiment except that an introduction hole and branch holes are not formed in the rotating shaft 9.

It should be noted that the exhaust pressure adjusting unit of this embodiment is featured by the following configuration. That is, in the rotating shaft takeoff connection 1b of the exhaust pipe 1, there is provided an introduction hole 10, for introducing purge gas, formed (being inclined) so as to have a slope angle of about 45 degrees with respect to the axis. In addition, the introduction hole 10 has an opening facing the gap 6a that is communicated spatially with the inner space of the exhaust pipe 1 on the inner side of the airtight O-ring 5 and constitutes a part of the gap 6 between the rotating shaft takeoff connection 1b of the exhaust pipe 1 and the rotating shaft 9. The introduction hole 10 has another opening in the outer circumferential surface of the flange of the rotating shaft takeoff connection 1b and the another opening is provided with a purge piping 11 connected thereto for supplying high pressure purge gas. Furthermore, the purge piping 11 is provided with a gas supply piping 11a for always supplying purge gas such as nitrogen gas ($N_2$ gas) or high pressure air to the gap 6a, a pure water supply piping 11b for intermittently supplying pure water to the gap 6a, and a switching valve 11c for controlling the opening/closing operation of the pure water supply piping 11b. As described above, the purge gas introduction means is composed of the introduction hole 10, the purge piping 11 and the gas supply piping 11a. In addition, the liquid introduction means is composed of the introduction hole 10, the purge piping 11, the pure water supply piping 11b and the switching valve 11c.

According to the exhaust apparatus of this embodiment, purge gas such as high pressure nitrogen gas or high pressure air can be introduced into the gap 6a communicated spatially with the inner space of the exhaust pipe 1, via the gas supply piping 11a, the purge piping 11 and the introduction hole 10 in order. Owing to the above-described configuration, even when the inner pressure becomes higher than the atmospheric pressure during the exhaust of resultant gas mixture (exhaust gas) such as harmful gas, by introducing high pressure purge gas into the gap 6a in advance, the phenomenon that the exhaust gas to be exhausted leaks outside from the exhaust pipe 1 can be prevented. It should be noted that when the inner pressure of the exhaust pipe 1 becomes high, the exhaust apparatus indicates a distinguished capability in resisting stronger against the flow of the resultant gas mixture toward the outside of the exhaust pipe 1 since the introduction hole 10 is not formed orthogonal to the axis of the rotating shaft 9 but formed inclining toward the inner portion of the exhaust pipe 1.

Furthermore, by supplying purge gas such as nitrogen gas via the gas supply piping 11a to the gap 6a, the life duration of the airtight O-ring 5 and the parts being in touch therewith is elongated, whereby the airtightness of the exhaust apparatus is enhanced further.

Moreover, as the exhaust apparatus has a structure such that pure water can be supplied via the pure water supply piping 11b to the related parts, accumulated solid substance adhering to such parts as the rotating shaft 9, the O-ring 5 and the rotating shaft takeoff connection 1b of the exhaust pipe 1 can be removed easily, whereby the airtightness of the exhaust apparatus is enhanced further.

It should be noted that in this embodiment, although the apparatus is configured to have one introduction hole 10 in the rotating shaft takeoff connection 1b, it may have many introduction holes in the same.

Third Embodiment

-Configuration of a Cleaning Apparatus-

Figure 3:
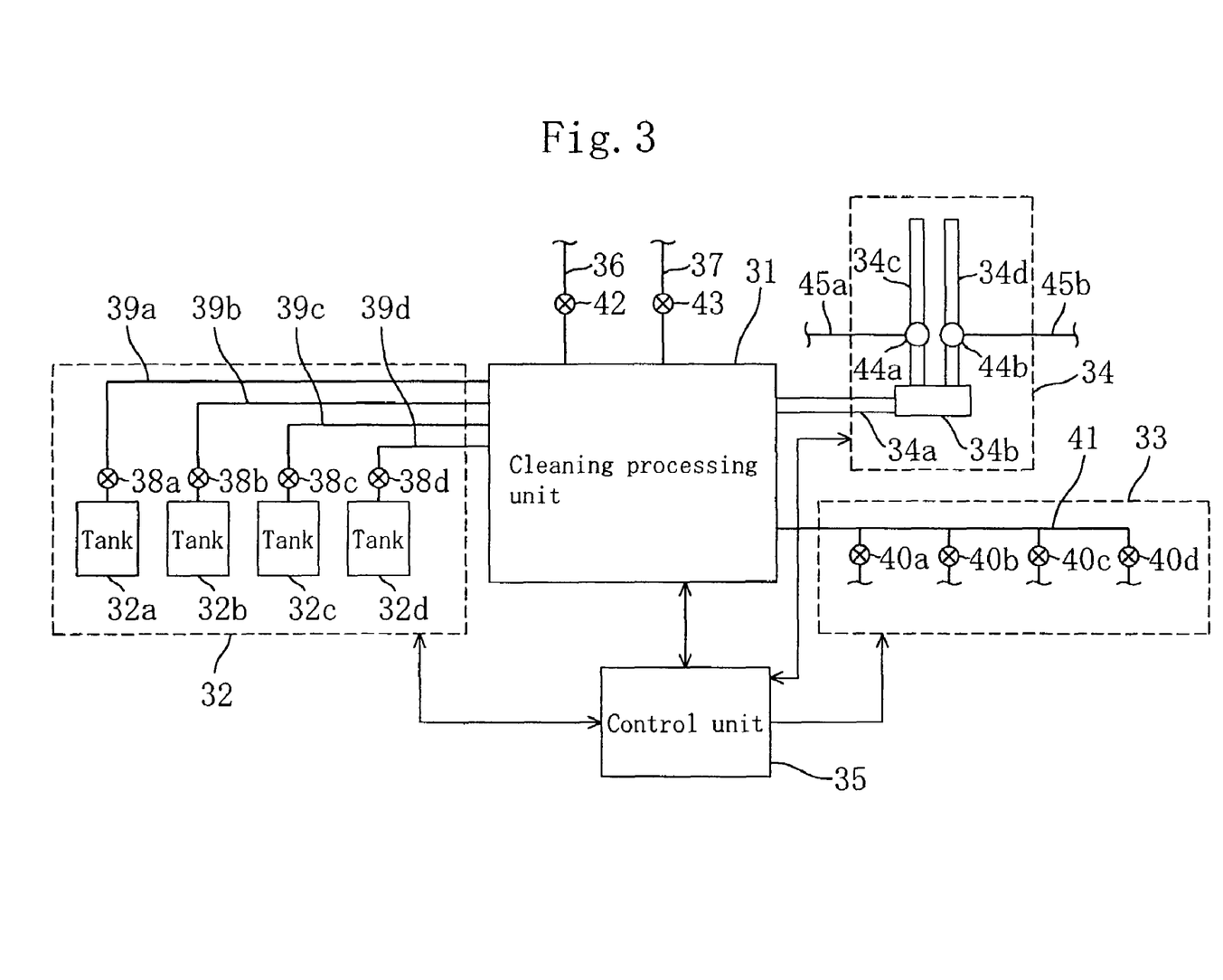
FIG. 3 is a block diagram illustrating a configuration of a cleaning apparatus used as a semiconductor device manufacturing system in a third embodiment of the present invention.

FIG. 3 is a block diagram illustrating the schematic configuration of a cleaning apparatus used as a semiconductor device manufacturing system in a third preferred embodiment of the present invention. This cleaning apparatus comprises a cleaning processing unit 31 for cleaning semiconductor wafers, a chemical storage unit 32 consisting of chemical feed tanks 32a, 32b, 32c and 32d for storing such chemicals as sulfuric acid, hydrofluoric acid, aqueous hydrogen peroxide, ammonia water and hydrochloric acid to clean wafers, a waste liquid collection unit 33 for collecting waste liquid generated after usage of chemicals in the cleaning processing unit 31 in accordance with the waste liquid classification, an exhaust processing unit 34 for exhausting such resultant gas mixture as harmful gas generated from the cleaning processing unit 31, and a control unit 35 for controlling respective equipments disposed in the cleaning processing unit 31, the chemical storage unit 32, the waste liquid collection unit 33 and the exhaust processing unit 34.

The cleaning processing unit 31 is in flow communication with a pure water supply pipe 36 for supplying pure water and a gas introduction pipe 37 for introducing nitrogen gas via switching valves 42 and 43, respectively. In addition, the chemical feed tanks 32a, 32b, 32c and 32d are in flow communication on feed sides with the cleaning processing unit 31 via chemical supply pipes 39a, 39b, 39c and 39d, respectively, on which switching valves 38a, 38b, 38c and 38d are mounted respectively.

Furthermore, the waste liquid collection unit 33 is provided with a drain line 41 to collect the waste liquid and the drain line 41 is in flow communication with branch pipes for collecting the waste liquid in accordance with the waste liquid classification, and switching valves 40a, 40b, 40c and 40d are mounted on the branch pipes, respectively. Note that the branch pipes are connected to the respective waste liquid exhaust pipes (not shown) to exhaust the waste liquid outside a clean room.

The exhaust processing unit 34 comprises a main exhaust pipe 34a having a flow communication portion connected to the cleaning processing unit 31, an exhaust distributing unit 34b provided on the end portion of the main exhaust pipe 34a, and an alkaline exhaust pipe 34c and an acid exhaust pipe 34d extending from the exhaust distributing unit 34b, respectively. The alkaline exhaust pipe 34c and the acid exhaust pipe 34d are equipped with exhaust pressure adjusting units 44a and 44b, respectively, capable of adjusting the opening area of the exhaust pipe variably. In addition, the end portions of the alkaline exhaust pipe 34c and the acid exhaust pipe 34d are connected to exhaust ducts (not shown) respectively for exhausting exhaust gas forcibly outside a clean room.

It should be noted that the cleaning apparatus of this embodiment is featured by the following configuration. That is, the alkaline exhaust pipe 34c and the acid exhaust pipe 34d are equipped with exhaust pressure adjusting units 44a and 44b, respectively, capable of adjusting the opening area of the exhaust pipe variably. The structure of these exhaust pressure adjusting units 44a and 44b is subject to the structural configurations explained in the first and second embodiments, concretely following the structures illustrated in FIGS. 1 and 2. That is, the exhaust pressure adjusting units 44a and 44b provided in the alkaline exhaust pipe 34c and the acid exhaust pipe 34d, respectively, are configured such that nitrogen gas, purge gas and pure water can be jetted into the gap formed in the rotating shaft takeoff connection 1b, which supports the switching valve 3 rotatably on the rotating shaft.

As the cleaning apparatus of this embodiment has the above-described configuration, the apparatus is capable of cleaning wafers by utilizing the same exhaust apparatus as that of the first and second embodiments, whereby the phenomenon that exhaust gas such as acid gas and alkaline gas generated during the wafer cleaning process leaks outside the exhaust pipe 1 can be prevented.

According to the semiconductor device manufacturing system of this embodiment, as is the case with the operation effected by the configurations of the first and second embodiments, it is possible that purge gas or pure water can be introduced into the exhaust pressure adjusting units 44a and 44b provided in the alkaline exhaust pipe 34c and the acid exhaust pipe 34d, respectively, via purge pipings 45a and 45b connected to a gas supply piping (not shown) and a pure water supply piping (not shown), respectively. Owing to the above-described configuration, even when resultant gas mixture (exhaust gas) such as harmful gas generated from chemicals for cleaning is being exhausted from the exhaust pipes 34c, 34d, and further the inner pressure of the exhaust pipes 34c, 34d becomes higher than the atmospheric pressure, by introducing purge gas into the gaps between the rotating shaft takeoff connections of the exhaust pipes 34c, 34d and the rotating shafts, respectively, the phenomenon that the exhaust gas to be exhausted leaks outside from the exhaust pipes 34c, 34d can be prevented.

-Procedure of Cleaning Process-

Next, a method for manufacturing a semiconductor device in which a wafer cleaning process is performed by utilizing the above-described cleaning apparatus will be explained by describing a cleaning process after the removal of a photoresist film (the ashing step) as a preferable example. Note that an exhaust apparatus described in this explanation can employ any one of the exhaust apparatuses employed in the first and second embodiments. Incidentally, in the following explanation, the exhaust pipe 1 corresponds to either the alkaline exhaust pipe 34c or the acid exhaust pipe 34d, and the exhaust pressure adjusting units 44a and 44b are explained by using the configuration of any one of the exhaust apparatuses of the first and second embodiments.

Figure 4:
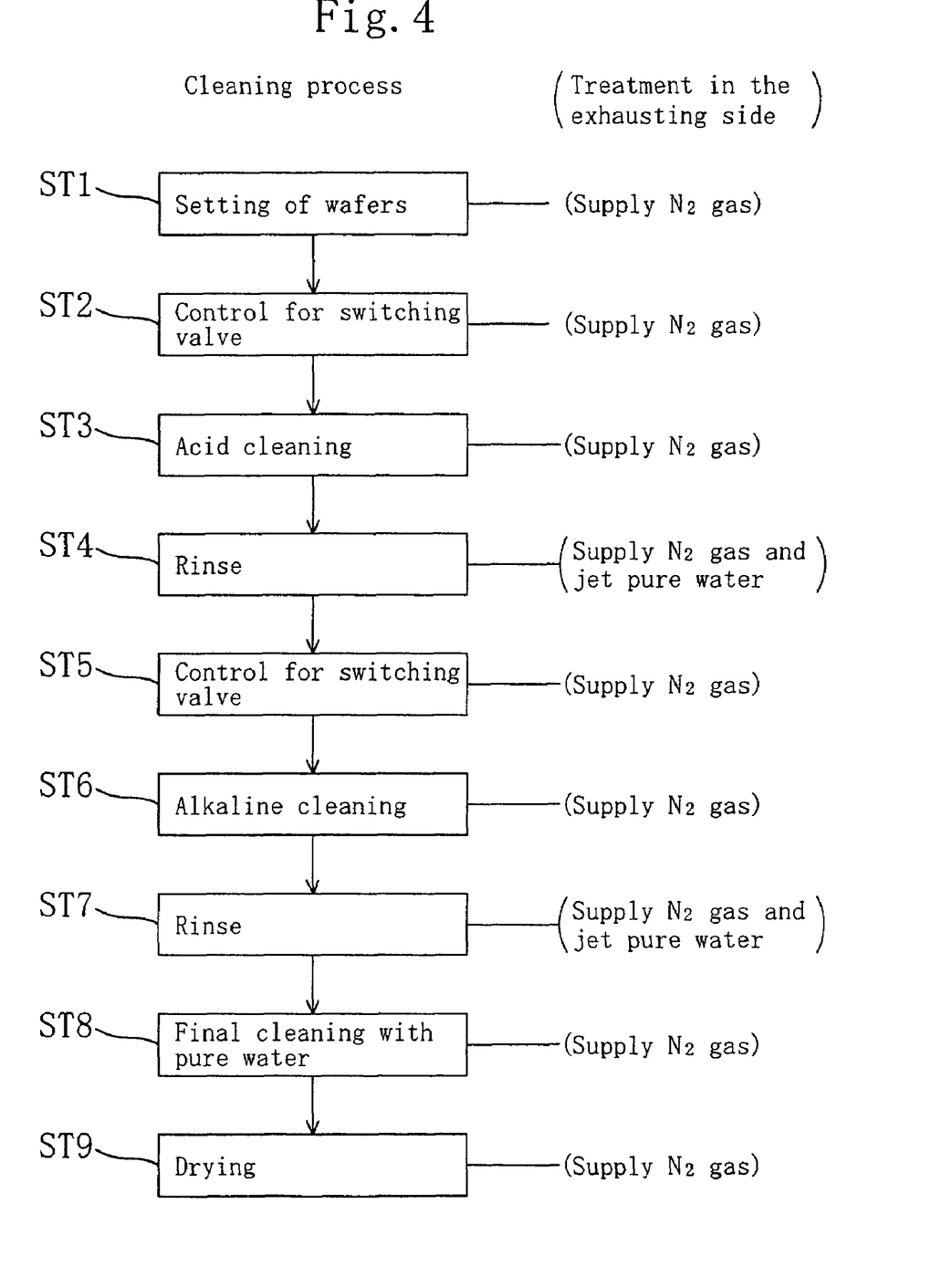
FIG. 4 is a flow chart diagram illustrating a procedure of a cleaning process performed in the third embodiment of the present invention.

FIG. 4 is a flow chart diagram illustrating the procedure of a cleaning process performed in this embodiment. Note that in the right side column of FIG. 4, the contents of the process performed in the exhaust apparatus subject to the procedure of the cleaning process are noted.

First, in step ST1, setting of wafers is carried out. That is, wafers are inserted into cassettes and then the cassette is loaded into a turntable located within a chamber of the cleaning processing unit 31. It should be noted that, prior to the setting of wafers, nitrogen gas ($N_2$ gas) is already being supplied from the gas supply piping 8a (or 11a) to the rotating shaft takeoff connection 1b of the exhaust pipe 1. In addition, the switching valve 8c (or 11c) of the pure water supply piping 8b (11b) is maintained to be closed.

Subsequently, in step ST2, control for switching valve is performed by the control unit 35 as follows: first, open the switching valve 44b of the acid exhaust pipe 34d and close the switching valve 44a of the alkaline exhaust pipe 34c; then, open the switching valves of the chemical feed tanks storing sulfuric acid and aqueous hydrogen peroxide in the chemical storage unit 32, while opening the switching valve for collecting the mixture of sulfuric acid and aqueous hydrogen peroxide in the waste liquid collection unit 33; during this operation, nitrogen gas ($N_2$ gas) is maintained to be supplied from the gas supply piping 8a (or 11a) and the switching valve 8c (or 11c) of the pure water supply piping 8b (or 11b) is maintained to be closed.

Subsequently, in step ST3, acid cleaning of wafers is carried out as follows: under the condition that the chamber of the cleaning processing unit 31 is maintained to be closed and the turntable is rotating, jet pure water against the wafers loaded within the cassettes and then spray sulfuric acid-hydrogen peroxide (a mixture of sulfuric acid and hydrogen peroxide) onto the same; during this operation, the switching valve 44b of the acid exhaust pipe 34d is still maintained to be opened; that is, acid gas generated from the sulfuric acid-hydrogen peroxide is forcibly exhausted to an acid processing apparatus located outside a clean room via the acid exhaust pipe 34*d* and the exhaust duct; in addition, during this operation, nitrogen gas (N₂ gas) is maintained to be supplied from the gas supply piping 8*a* (or 11*a*) and the switching valve 8*c* (or 11*c*) of the pure water supply piping 8*b* is maintained to be closed.

Subsequently, in step ST4, rinse for cleaning wafers with pure water and N₂ gas is carried out. That is, the chemicals adhering to the wafers are removed. During this operation, the switching valve 44*b* of the acid exhaust pipe 34*d* is still maintained to be opened.

Furthermore, in the rinse step for cleaning wafers, such parts as the switching valve 3 and the rotating shaft 2 (or 9) of the exhaust valve 1 are rinsed by spraying pure water from shower heads provided in the exhaust distributing unit 34*b* toward such parts as the switching valve 3 and the rotating shaft 2 (or 9).

Simultaneously, the switching valve 8*c* (or 11*c*) of the pure water supply piping 8*b* (or 11*b*) is opened and then all parts (such as the rotating shaft 2 (or 9), the switching valve 3 and the airtight O-ring 5) disposed around the inner circumferential surface of the rotating shaft takeoff connection 1*b* are cleaned by jetting pure water from the branch holes 7*b* connected to the introduction hole 7 (or the introduction hole 10) into the gap 6*a* formed in the rotating shaft takeoff connection 1*b* of the exhaust pipe 1. During this operation, the gas supply piping 8*a* (or 11*a*) is maintained to be opened and thus the pure water is jetted by the pressure of nitrogen.

When the acid related process steps described above are completed, operation for switching valve is performed by the control unit 35 in step ST5 as follows: that is, close the switching valve 44*b* of the acid exhaust pipe 34*d* and then open the switching valve 44*a* of the alkaline exhaust pipe 34*c*; subsequently, open the switching valves of the chemical feed tanks storing ammonia water and aqueous hydrogen peroxide in the chemical storage unit 32, while opening the switching valve for collecting a mixture of ammonia water and aqueous hydrogen peroxide in the waste liquid collection unit 33; during the above-stated switching operation, nitrogen gas (N₂ gas) is maintained to be supplied from the gas supply piping 8*a* (or 11*a*) and the switching valve 8*c* (or 11*c*) of the pure water supply piping 8*b* (or 11*b*) is maintained to be closed.

Subsequently, in step ST6, an alkaline cleaning of wafers is carried out as follows: within the chamber of the cleaning processing unit 31, spray ammonia water-hydrogen peroxide (a mixture of ammonia water and aqueous hydrogen peroxide) onto the wafers; during this operation, the switching valve 44*a* of the alkaline exhaust pipe 34*c* is still maintained to be opened; in addition, nitrogen gas (N₂ gas) is maintained to be supplied from the gas supply piping 8*a* (or 11*a*) and the switching valve 8*c* (or 11*c*) of the pure water supply piping 8*b* is maintained to be closed.

Subsequently, in step ST7, rinse for cleaning wafers with pure water and N.sub.2 gas is carried out. That is, the chemicals adhering to the wafers are removed. During this operation, the switching valve 44*a* of the alkaline exhaust pipe 34*c* is still maintained to be opened. That is, alkaline gas generated from the ammonia water-hydrogen peroxide is forcibly exhausted to an alkaline processing apparatus located outside a clean room via the alkaline exhaust pipe 44*c* and the exhaust duct.

Furthermore, in the rinse step for cleaning wafers, such parts as the switching valve 3 and the rotating shaft 2 (or 9) of the exhaust pipe 1 are rinsed by spraying pure water from shower heads provided in the exhaust distributing unit 34*b* toward such parts as the switching valve 3 and the rotating shaft 2 (or 9).

Simultaneously, the switching valve 8*c* (or 11*c*) of the pure water supply piping 8*b* (or 11*b*) is opened and then all parts (such as the rotating shaft 2 (or 9), the switching valve 3 and the airtight O-ring 5) disposed around the inner circumferential surface of the rotating shaft takeoff connection 1*b* are cleaned by jetting pure water from the branch holes 7*b* connected to the introduction hole 7 (or the introduction hole 10) into the gap 6*a* formed in the rotating shaft takeoff connection 1*b* of the exhaust pipe 1. During this operation, the gas supply piping 8*a* (or 11*a*) is maintained to be opened and thus the pure water is jetted by the pressure of nitrogen.

After the rinse for cleaning wafers is completed, in step ST8, a final cleaning for cleaning wafers with pure water is carried out within the chamber of the cleaning processing unit 31 and then in step ST9, the wafers are dried by blowing N₂ gas into the chamber. During this operation, nitrogen gas (N₂ gas) is maintained to be supplied from the gas supply piping 8*a* (or 11*a*) and the switching valve 8*c* (or 11*c*) of the pure water supply piping 8*b* is maintained to be closed.

It should be noted that the cleaning method of the present invention is not limited to the above-described cleaning process of the embodiment, in which such parts as the switching valve 3 and the rotating shaft 2 (or 9) of the exhaust pipe 1 are rinsed by spraying pure water from shower heads provided in the exhaust distributing unit 34*b* toward such parts as the switching valve 3 and the rotating shaft 2 (or 9), and at the same time, all parts disposed around the inner circumferential surface of the rotating shaft takeoff connection 1*b* are cleaned by jetting pure water into the gap 6*a* formed in the rotating shaft takeoff connection 1*b* of the exhaust pipe 1. That is, the rinse operation performed by spraying pure water toward such parts as the switching valve 3 and the rotating shaft 2 (or 9) from beneath within the exhaust pipe 1, and the rinse operation performed by jetting pure water toward all parts disposed around the inner circumferential surface of the rotating shaft takeoff connection 1*b* of the exhaust pipe 1 can be independently carried out respectively.

Furthermore, the cleaning method of the present invention can include another configuration in the following manner. That is, N₂ gas is not necessarily supplied continuously into the rotating shaft takeoff connection 1*b* of the exhaust pipe 1 in accordance with the cleaning process flow chart shown in FIG. 4, but may be supplied only when the cleaning steps such as an acid cleaning, an alkaline cleaning and a rinse are carried out. In addition, instead of N₂ gas, other gas such as inactive gas or high pressure air may be supplied.

Moreover, the cleaning method of the present invention can include still another configuration in the following manner. That is, pure water may be jetted toward the rotating shaft takeoff connection 1*b* of the exhaust pipe 1 in the acid cleaning step (step ST3) and/or the alkaline cleaning step (step ST6) in addition to the steps ST4 and ST7, though pure water is jetted toward the rotating shaft takeoff connection 1*b* of the exhaust pipe 1 only in the steps ST4 and ST7 for rinsing wafers when following the flow chart shown in FIG. 4.

According to the method for manufacturing a semiconductor device of the present invention, as purge gas such as N₂ gas or high pressure gas is supplied into the rotating shaft takeoff connection 1*b* of the exhaust pipe 1 in chemical cleaning steps such as an acid cleaning step or an alkaline cleaning step, exhaust gas such as acid gas or alkaline gas can be prevented from leaking through the gap 6 formed in the rotating shaft takeoff connection 1b of the exhaust pipe 1 by using the purge gas.

Such operation is performed for the following reasons. The exhaust gas supplied into the exhaust pipe 1 generally indicates negative pressure lower than the atmospheric pressure, but occasionally indicates positive pressure higher than the atmospheric pressure depending on environmental conditions. In this case, the exhaust gas is going to leak outside through the gap 6 formed in the rotating shaft takeoff connection 1b of the exhaust pipe 1. However, by adjusting the pressure of the purge gas higher than the inner pressure of the exhaust pipe 1, the exhaust gas is pushed back through the gap 6 to the inner side of the exhaust pipe 1 and thus the exhaust gas can be prevented from leaking outside.

Furthermore, by supplying purge gas into the rotating shaft takeoff connection 1b of the exhaust pipe 1, accumulated solid substance adhering to the airtight O-ring 5 and the parts thereabout are blown out and thus the duration life of the airtight O-ring 5 and the parts thereabout are elongated.

Moreover, after the completion of a wafer chemical cleaning or during a wafer chemical cleaning, the rotating shaft takeoff connection 1b of the exhaust pipe 1 is cleaned with pure water and accumulated solid substance adhering to the airtight O-ring 5 and the parts thereabout are thus removed by the pure water cleaning, whereby the duration life of the airtight O-ring 5 and the parts thereabout are elongated.

It should be note that in each of the above-described embodiments, although pure water is jetted into the gap 6 formed in the rotating shaft takeoff connection 1b of the exhaust pipe 1, water vapor may be supplied thereto instead of pure water. Or, instead of pure water or water vapor, cleaning solution consisting of materials other than water or vapor consisting of materials other than water may be supplied.

What is claimed is:

1. A method for manufacturing a semiconductor device utilizing a semiconductor device manufacturing system including a wafer processing apparatus and an exhaust apparatus, said exhaust apparatus is equipped with at least one exhaust pipe, which is connected to said wafer processing apparatus, and an exhaust pressure adjusting unit for adjusting an opening area of said exhaust pipe variably, said exhaust pressure adjusting unit including:
   a switching valve, provided in said exhaust pipe such that said switching valve can be rotated freely, for varying an opening area of said exhaust pipe;
   a rotating shaft, extending from inside to outside of said exhaust pipe, for rotating said switching valve fixed thereon;
   a shaft support provided in said exhaust pipe for supporting said rotating shaft so that said rotating shaft can be rotated freely; and
   gas introduction means having a communicating pass connecting a gap between said shaft support and said rotating shaft to the exterior of said exhaust pipe, and for introducing purge gas into said gap via said communicating pass,
   the method comprising:
   a step (a) for cleaning a wafer with chemicals in said wafer processing apparatus;
   a step (b) for rinsing said wafer with water after completion of said step (a); and
   a step (c) for drying said wafer in said wafer processing apparatus after completion of said step (b),
   wherein said step (a) includes a sub-step of introducing purge gas into said gap between said shaft support and said rotating shaft using said exhaust pressure adjusting unit.

2. The method for manufacturing a semiconductor device according to claim 1 further comprising a cleaning agent introduction step performed simultaneously in any one of said steps (a) and (b), or inserted between said steps (a) and (b), for introducing a cleaning solution or a cleaning vapor into said gap between said shaft support and said rotating shaft.

3. The method for manufacturing a semiconductor device according to claim 1, wherein said exhaust apparatus further includes an exhaust distributing unit extending from said wafer processing apparatus and said at least one exhaust pipe is composed of a plurality of exhaust pipes extending from said exhaust distributing unit, each of said plurality of exhaust pipe being provided with said exhaust pressure adjusting unit.

4. The method for manufacturing a semiconductor device according to claim 1, wherein said exhaust pressure adjusting unit further includes introduction means for introducing a cleaning vapor into said gap between said shaft support and said rotating shaft.

5. The method for manufacturing a semiconductor device according to claim 1, wherein said exhaust pressure adjusting unit further includes an airtight O-ring provided in said gap between said shaft support and said rotating shaft.

6. The method for manufacturing a semiconductor device according to claim 1, wherein said communicating pass includes a gas introduction vent extending from an opening formed on an external side of said exhaust pipe to an internal side of said exhaust pipe, and a plurality of gas supplying vents branching off from said gas introduction vent and each having an opening at said gap.

7. The method for manufacturing a semiconductor device according to claim 5, wherein said communicating pass includes a gas introduction vent extending from an opening formed on an external side of said exhaust pipe to an internal side of said exhaust pipe, and a plurality of gas supplying vents branching off from said gas introduction vent and each having an opening at said gap.

8. The method for manufacturing a semiconductor device according to claim 7, wherein said opening of said gas introduction vent is formed in an external end surface of said rotating shaft, and each of said plurality of gas supplying vents has an opening at said gap nearer to the interior of said exhaust pipe than said airtight O-ring.

9. The method for manufacturing a semiconductor device according to claim 6, wherein said branch holes are formed with an inclination to the axis of said rotating shaft.

10. The method for manufacturing a semiconductor device according to claim 1, wherein said communicating pass is provided within said rotating shaft.

* * * * *